(12) United States Patent
Kitagawa (10) Patent No.: US 10,840,910 B2
(45) Date of Patent: Nov. 17, 2020

(54) APPARATUSES AND METHODS FOR LEVEL SHIFTING

(71) Applicant: MICRON TECHNOLOGY, INC., Boise, ID (US)

(72) Inventor: Katsuhiro Kitagawa, Hachioji (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/177,821

(22) Filed: Nov. 1, 2018

(65) Prior Publication Data

US 2019/0074838 A1 Mar. 7, 2019

Related U.S. Application Data

(62) Division of application No. 15/055,230, filed on Feb. 26, 2016, now Pat. No. 10,128,847.

(51) Int. Cl.
*H03K 19/0185* (2006.01)
*H03K 19/00* (2006.01)

(52) U.S. Cl.
CPC . *H03K 19/018521* (2013.01); *H03K 19/0013* (2013.01); *H03K 19/018507* (2013.01)

(58) Field of Classification Search
CPC ... H03K 19/018521; H03K 19/017509; H03K 19/0175; H03K 19/0185; H03K 19/018507; H03K 19/018528; H03K 19/01855; H03K 19/018571
USPC .............. 327/148, 156–159, 333, 536–538
See application file for complete search history.

(56) References Cited

U.S. PATENT DOCUMENTS

| | | | |
|---|---|---|---|
| 4,818,999 A | 4/1989 | Kobayashi et al. | |
| 6,834,020 B2 | 12/2004 | Takahashi et al. | |
| 7,502,275 B2 | 3/2009 | Nii et al. | |
| 7,835,213 B2 | 11/2010 | Dono et al. | |
| 7,924,073 B2 | 4/2011 | Park | |
| 7,956,642 B2 | 6/2011 | Lee | |
| 8,558,613 B2 | 10/2013 | Acosta-Serafini et al. | |
| 2009/0278567 A1* | 11/2009 | Suzuki | H03K 19/0185 326/80 |
| 2014/0031076 A1* | 1/2014 | Tang | G01R 31/2832 455/550.1 |
| 2017/0250689 A1 | 8/2017 | Kitagawa | |

* cited by examiner

*Primary Examiner* — Diana J. Cheng
(74) *Attorney, Agent, or Firm* — Dorsey & Whitney LLP (57) ABSTRACT

Apparatuses and methods for level shifting in a semiconductor device are described. An example apparatus includes: a splitter circuit that operates on a first voltage potential to produce a first signal having a first polarity and a second signal having a second polarity that is substantially opposite to the first polarity; an one-shot pulse circuit that operates on the first voltage potential to produce a first one-shot pulse signal responsive to the first signal and a second one-shot pulse signal responsive to the second signal; and a logic circuit configured to operate on a second voltage potential to produce a third signal responsive to the first and second one-shot pulse signals, the second voltage potential being different from the first voltage potential.

19 Claims, 7 Drawing Sheets

APPARATUSES AND METHODS FOR LEVEL SHIFTING

CROSS REFERENCE TO RELATED APPLICATION(S)

This application is a divisional of U.S. patent application Ser. No. 15/055,230 filed Feb. 26, 2016 and issued as U.S. Pat. No. 10,128,847 on Nov. 13, 2018. The aforementioned application, and issued patent, is incorporated herein by reference, in its entirety, for any purpose.

BACKGROUND

High speed of memory access, and reduced power consumption are features that are demanded from semiconductor devices. In recent years, there has been an effort to reduce power consumption and increase access speed for semiconductor devices. As part of that effort to reduce power consumption, it may be desirable to use a level shifter circuit. The level shifter circuit provides a peripheral voltage (VPERI) for operating peripheral circuits throughout the semiconductor device. The peripheral voltage (VPERI) is typically lower than a power supply voltage provided to a semiconductor device (VDD).

Figures 1, 2:
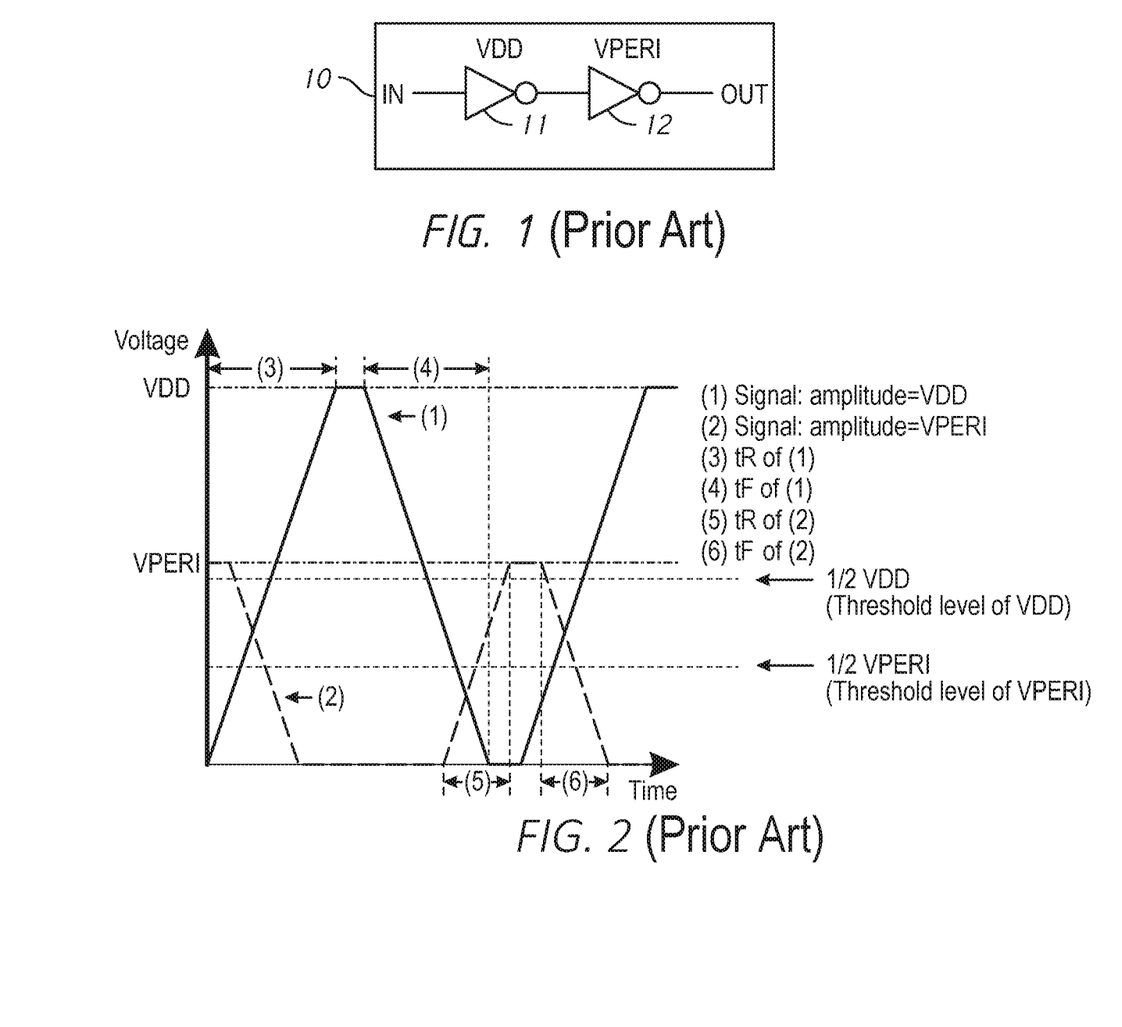
FIG. 1 is a circuit diagram of an example level shifter circuit in a semiconductor device.
FIG. 2 is a timing diagram of signals in the level shifter circuit of FIG. 1.

FIG. 1 is a circuit diagram of an example level shifter circuit in a semiconductor device. The level shifter circuit 10 includes inverters 11 and 12 arranged in series. The level shifter circuit 10 may convert a signal with a high voltage (e.g., the power supply voltage (VDD)) into a signal with a low voltage (e.g., the peripheral voltage (VPERI)). Signal characteristics of waveforms of the signal may change due to conversion of the signal from the signal with the high voltage into the signal with the low voltage. Several factors may cause the changes in the signal characteristics. For example, the several factors may include transition times (TT) of the signals and threshold levels (TL) of input and output signals of the level shifter circuit 10.

FIG. 2 is a timing diagram of signals in the level shifter circuit of FIG. 1. A signal makes transitions, such as a rise from a logic low level to a logic high level during a rise time (tR) and a fall from the logic high level to the logic low level during a fall time (tF). The signal has transition edges, such as rising edges and falling edges. An input signal (1) of the inverter 11 has a voltage having an amplitude (VDD) shown as a level VDD and the input signal rises from the logic low level to the logic high level represented by the voltage VDD during a rise time (tR) (3) and falls from the logic high level to the logic low level during a fall time (tF) (4) in FIG. 2. An output signal (2) of the inverter 12 has a voltage having an amplitude (VPERI) shown as a level VPERI and the output signal rises from a logic low level to a logic high level represented by the voltage VPERI during a rise time (tR) (5) and falls during a fall time (tF) (6) in FIG. 2. For example, the power supply voltage VDD may be 1.5V and the peripheral voltage VPERI may be 0.8V.

A threshold level (TL) represents a voltage above which a signal is considered to be a logic high level and a signal below the threshold level (TL) is considered a logic low level. In general, a waveform of the signal may be divided into two sections, a high-pulse section where the signal is above the threshold level (TL) and a low-pulse section where the signal is below the threshold level (TL). The threshold level (TL) may be approximately 50% of a signal. A signal having an amplitude VDD may be divided by the TL of VDD, which is ½ VDD. A signal having an amplitude VPERI may be divided by the TL of VPERI, which is ½ VPERI. Thus, the level shifter circuit 10 has different threshold levels ½ VDD and ½ VPERI for the input signal and the output signal, respectively. For example, the signal having the amplitude VDD and the signal having the amplitude VPERI having similar rates of voltage rise and voltage fall may have different rise times and fall times due to different amplitudes. In this example, durations of a logic low level before and after the level shifter circuit 10 become very different, even if durations of a logic high level between the rise time and the fall time remain constant before and after the level shifter circuit 10. Thus, a duty cycle of the output signal of the level shifter circuit 10 may be different from a duty cycle of the input signal of the level shifter circuit 10 when a cycle period is the same while rise times and fall times are different as shown in FIG. 2.

TABLE 1

Cycle periods, duty cycles, rise and fall times of a level shifter circuit.

| Signal | Cycle period (ps) | Duty cycle (%) | Rise time (tR) (ps) | Fall time (tF) (ps) |
|---|---|---|---|---|
| Amplitude: VDD | 1000 | 50.0 | 400 ((3) in FIG. 2) | 400 ((4) in FIG. 2) |
| Amplitude: VPERI | 1000 | 31.7 | 213 ((5) in FIG. 2) | 213 ((5) in FIG. 2) |

Table 1 shows an example of cycle periods, duty cycles, rise and fall times of signals of the level shifter circuit 10 as shown in FIG. 2. In this example, the duty cycle of the output signal is 31.7%, which is lower than the duty cycle of the input signal, 50%. Thus the duty cycle of the signal is distorted from 50% to 31.7%.

Recently, duty cycle correction using adjustments in sizes of p-channel and n-channel transistors and a number of fan-outs of the transistors in level shifter circuits have been implemented, in order to maintain signal characteristics before and after level shifting without distorting a duty cycle. For example, different numbers of fan-outs are assigned to a rise transition and a fall transition, so that durations of the high-pulse section and the low-pulse section are adjusted to maintain the duty cycle. However, duty cycle adjustments in sizes of transistors or a number of fan-outs, pose several problems.

First, the duty cycle correction may cause unexpected results if transistor characteristics are unbalanced between the p-channel and n-channel transistors in the level shifter circuit. Duty cycle distortion due to variation of transistor characteristics among chips may not be adjusted by the above size and fan-out adjustments.

Second, the sizes of the transistors are determined in a product design phase, assuming that voltage levels of the input/output signals remain constant. For example, U.S. Pat. No. 7,835,213 discloses a level shifter circuit used in dynamic random-access memory (DRAM) including a memory cell array, input/output buffers and peripheral circuits between the memory cell array and the input/output buffers having transistors fine-tuned threshold voltage and thickness of gate insulation film. However, this type of level shifter circuits may not be able to handle changes in the input signal, such as a source voltage. The DRAM including such a level shifter circuit, therefore, is not suitable for applications where the DRAM may receive a source voltage different from the source voltage assumed in the product design phase.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 3:
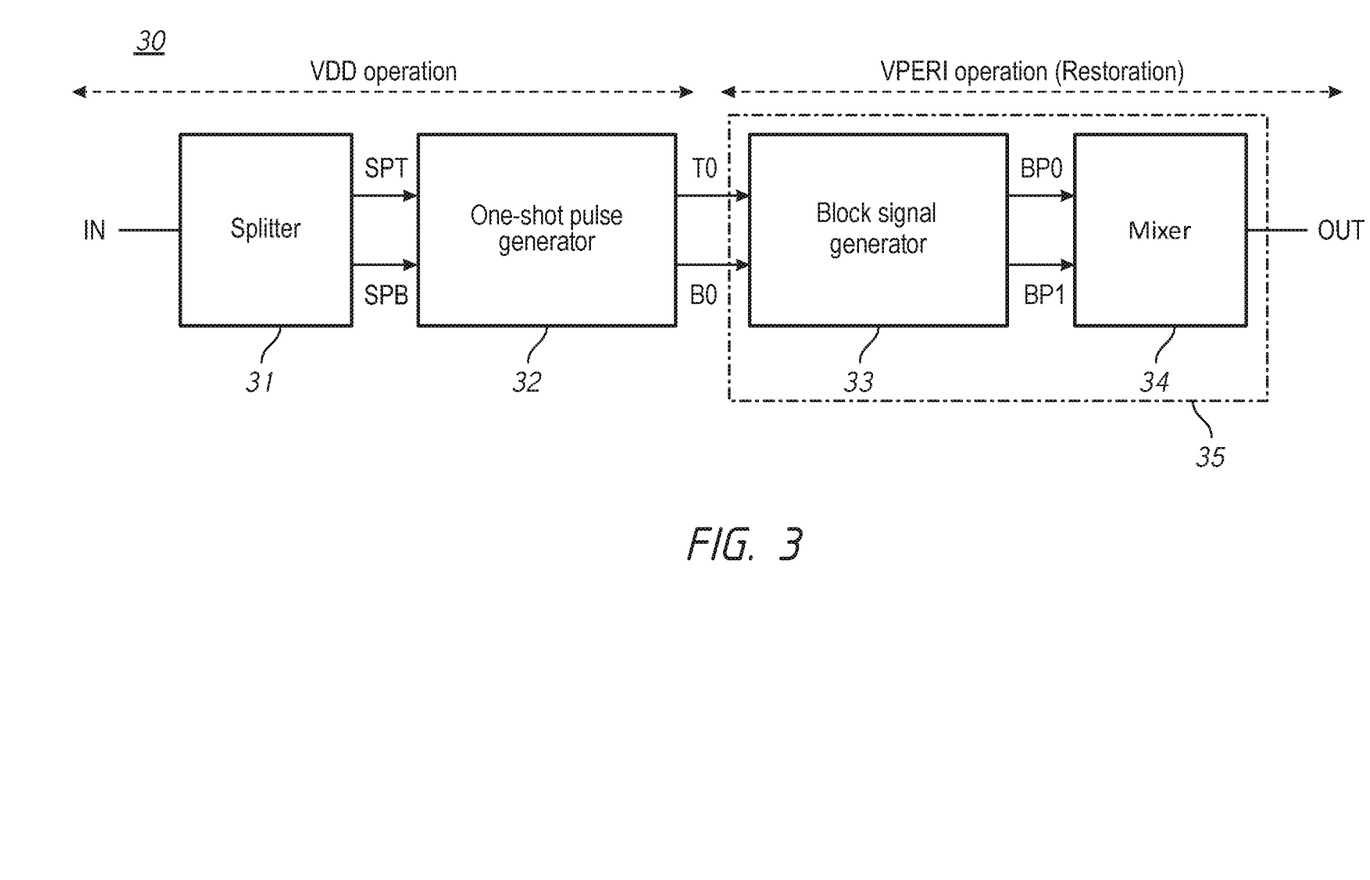
FIG. 3 is a simplified block diagram of a level shifter circuit in a semiconductor device, in accordance with an embodiment of the present disclosure.

FIG. 3 is a simplified block diagram of a level shifter circuit in a semiconductor device, in accordance with an embodiment of the present disclosure. The level shifter circuit 30 receives an input signal IN having an amplitude between a voltage (VDD) and a reference voltage. The voltage (VDD) may be a power supply voltage, and the reference voltage may be ground. A splitter circuit 31 provides complementary signals SPT and SPB. The complementary signals SPT and SPB have opposite polarities to each other. A one-shot pulse generator circuit 32 provides one-shot pulse signals T0 and B0 responsive to the complementary signals SPT and SPB, respectively. The one-shot pulse signal T0 includes one-shot pulses. For example, the one-shot pulses may be pulses having a logic low level. The one-shot pulse generator circuit 32 may generate a falling edge of the one-shot pulse signal T0 based on a rising edge of the signal SPT. The one-shot pulse generator circuit 32 may generate a rising edge of the one-shot pulse signal T0 after a first delay from the falling edge of the one-shot pulse signal T0, resulting in the one-shot pulse signal T0 having a pulse width based on the first delay. In some embodiments, the pulse width of the one-shot pulse signal T0 is less than a half cycle period of the signal SPT. Similarly, the one-shot pulse signal B0 includes one-shot pulses. For example, the one-shot pulses may be pulses having a logic low level. The one-shot pulse generator circuit 32 may generate a falling edge of the one-shot pulse signal B0 based on a rising edge of the signal SPB. The one-shot pulse generator circuit 32 may generate a rising edge of the one-shot pulse signal B0 after a second delay from the falling edge of the one-shot pulse signal B0, resulting in the one-shot pulse signal B0 having a pulse width based on the second delay. In one embodiment, the first delay and the second delay are substantially the same length of time. In some embodiments, the pulse width of the one-shot pulse signal B0 is less than a half cycle period of the signal SPB. The one-shot pulse signals T0 and B0 have an amplitude between a peripheral voltage (VPERI) and the reference voltage. The rising edge of the one-shot pulse signal T0 corresponds with the rising edge of the input signal IN and the rising edge of the one-shot pulse signal B0 corresponds with the falling edge of the input signal IN.

A logic circuit 35 operates on the peripheral voltage (VPERI) that is different from the power supply voltage (VDD). The logic circuit 35 provides an output signal responsive to the one-shot pulse signals from the one-shot pulse generator circuit 32. The logic circuit 35 may include a block signal generator circuit 33 and a mixer circuit 34. The block signal generator circuit 33 generates block signals BP0 and BP1 having a cycle period responsive to a cycle period of the input signal IN. For example, the block signal may have the same cycle period of the input signal IN or a cycle period twice the cycle period of the input signal IN. The mixer circuit 34 provides an output signal OUT of the level shifter circuit 30 by synthesizing the block pulse signals BP0 and BP1.

By using the splitter circuit 31 and the one-shot pulse generator circuit 32 in the level shifter circuit 30, it may be possible to restore an interval between a rising edge and a falling edge of the input signal IN of the level shifter circuit 30 from complementary signals into the output signal OUT of the level shifter circuit 30, without duty cycle distortion.

Figure 4:
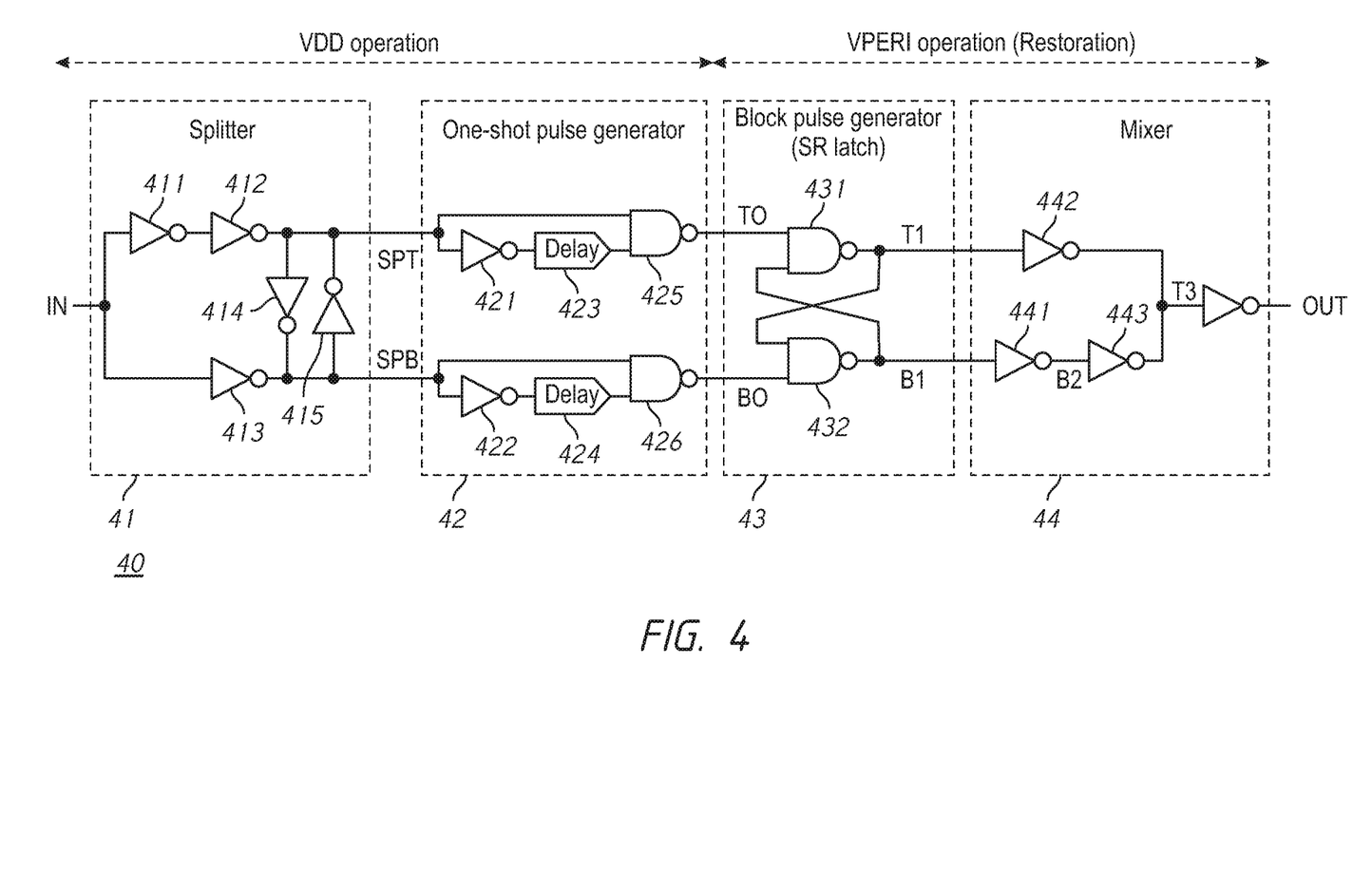
FIG. 4 is a circuit diagram of a level shifter circuit in a semiconductor device, in accordance with an embodiment of the present disclosure.

FIG. 4 is a circuit diagram of a level shifter circuit in a semiconductor device, in accordance with an embodiment of the present disclosure. The level shifter circuit 40 includes a splitter circuit 41, a one-shot pulse generator circuit 42, a block signal generator circuit 43 and a mixer circuit 44. The splitter circuit 41 receives an input signal IN and provides complementary signals SPT and SPB responsive to the input signal IN of the level shifter circuit 40. The splitter circuit 41 provides the signal SPT through a path including inverters 411, 412 and provides the complementary signal SPB through a path including the inverter 413. Propagation delay through the inverters 411 and 412 is similar to the propagation delay through the inverter 413. In some embodiments, the inverter 413 has a different drive strength than inverters 411 and 412 so that the propagation delay through the respective paths are similar. Inverters 414 and 415 are coupled as a latch to provide the complementary signals SPT and SPB.

The one-shot pulse generator circuit 42 includes inverters 421 and 422, delay circuits 423 and 424 and NAND gates 425 and 426. The signal SPT is provided to the NAND gate 425 directly and via the inverter 421 and the delay circuit 423. The NAND gate 425 provides an output signal T0 to the block signal generator circuit 43. The output signal T0 has negative one-shot pulses having falling edges corresponding to rising edges of the signal SPT and a pulse width based on a delay of the delay circuit 423. Similarly, the complementary signal SPB is provided to the NAND gate 426 directly and via the inverter 422 and the delay circuit 424. The NAND gate 426 provides an output signal B0 to the block signal generator circuit 43. The output signal B0 has negative one-shot pulses having falling edges corresponding to rising edges of the complementary signal SPB and a pulse width based on a delay of the delay circuit 423. The rising edges of the complementary signal SPB and the falling edges of the signal SPT are in phase.

Figure 5:
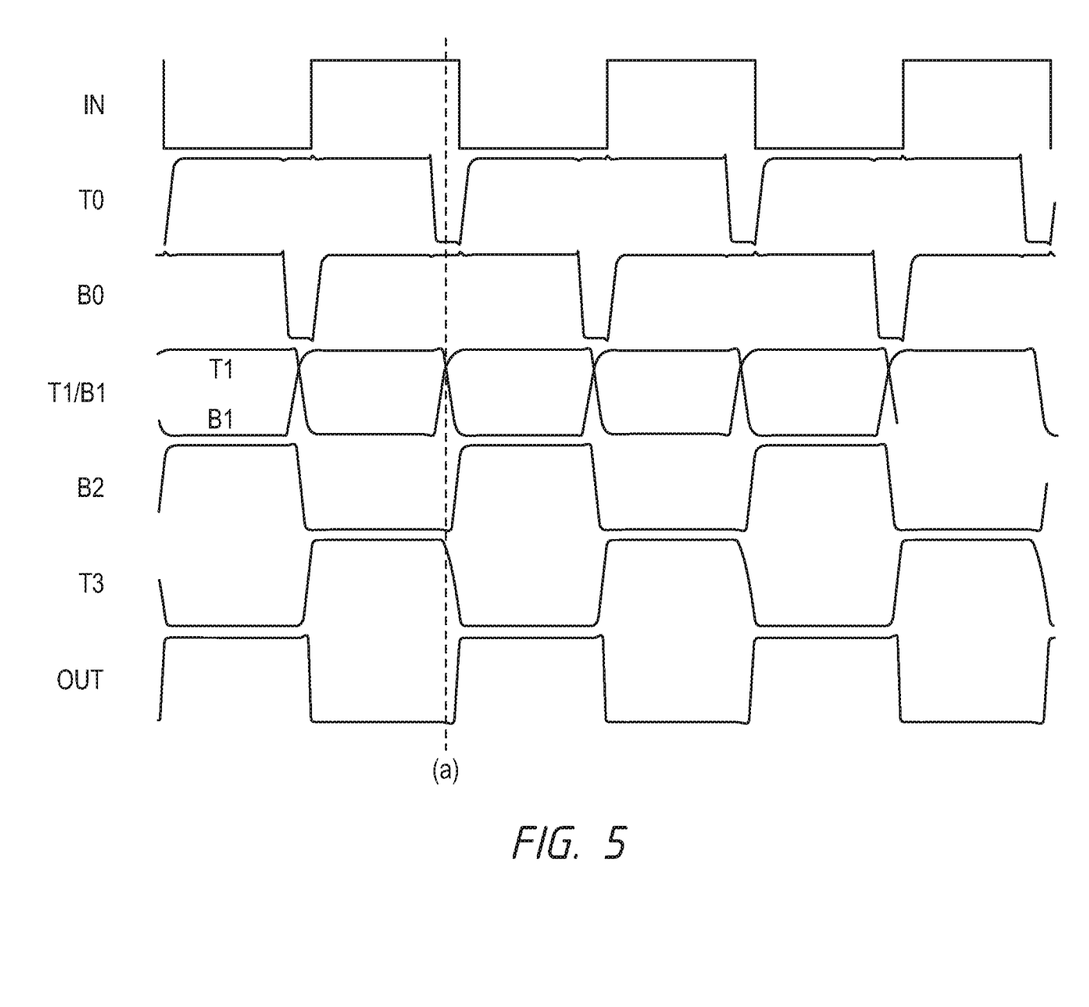
FIG. 5 is a timing diagram of signals in the level shifter circuit of FIG. 4, in accordance with an embodiment of the present disclosure.

In one embodiment, the block signal generator circuit 43 may be a set/reset (SR) latch. For example, the SR latch 43 may include two NAND gates 431, 432. The SR latch 43 may provide complementary signals T1 and B1 responsive to rising edges of the one-shot pulse signals T0 and B0. FIG. 5 is a timing diagram of signals in the level shifter circuit of FIG. 4, in accordance with an embodiment of the present disclosure.

The SR latch 43 provides the signal T1 having rising and falling edges corresponding to falling and rising edges, respectively, of the input signal IN. The one-shot pulse signal T0 is provided to the NAND gate 431. In order to generate falling edges of the signal T1, the one-shot pulse signal B0 may be provided to the NAND gate 432. The SR latch 43 also provides the signal B1 having rising and falling edges corresponding to rising and falling edges, respectively, of the input signal IN. The one-shot pulse signal B0 is provided to the NAND gate 432. In order to generate falling edges of the signal B1, the one-shot pulse signal T0 may be provided to the NAND gate 431 and further to the NAND gate 432. The signal T1 is provided by NAND operation of the signals T0 and B1 by the NAND gate 431. The signal B1 is provided by NAND operation of the signals T1 and B0 by the NAND gate 432. Falling edges of the one-shot pulse signal T0 correspond to the rising edges of the signal T1. The falling edges of the signal T1 are in phase with the rising edges of the complementary signal B1 as shown at time (a) of FIG. 5. Falling edges of the one-shot pulse signal B0 correspond to the rising edges of the complementary signal B1. Thus, the falling edges and the rising edges of the signal T1 correspond to the rising edges of the one-shot pulse signals T0 and B0, respectively. The rising edges of the one-shot pulse signals T0 and B0 are not affected by duty cycle distortion due to level shifting. Thus, the duty cycles of the complementary signals T1 and B1 are substantially the same as the duty cycle of the input signal IN.

In one embodiment, the mixer circuit 44 may provide two parallel paths, one with an inverter and the other with two inverters. The mixer circuit 44 may function to average the phase differences in the complementary signals T1 and B1 due to the differences in the propagation delay of the parallel paths by mixing complementary signals T1 and B1. Because the rising edges and the falling edges of the output signal OUT are determined separately by rising edges of the complementary signals SPT and SPB from the splitter circuit 41 and by one-shot pulse signals from the one-shot pulse generator circuit 42, the output signal OUT may have the duty cycle of the input signal IN after level shifting. An inverter 441 inverts the signal B1 and provides a signal B2. The signal T3 is obtained by mixing an inverted signal of the signal T1 by an inverter 442 and an inverted signal of the signal B2 by an inverter 443. As described, the mixer circuit 44 may correct duty cycle distortion that may be caused by the block signal generator circuit 43 due to different propagation delays of logic gates on propagation paths.

Figure 6:
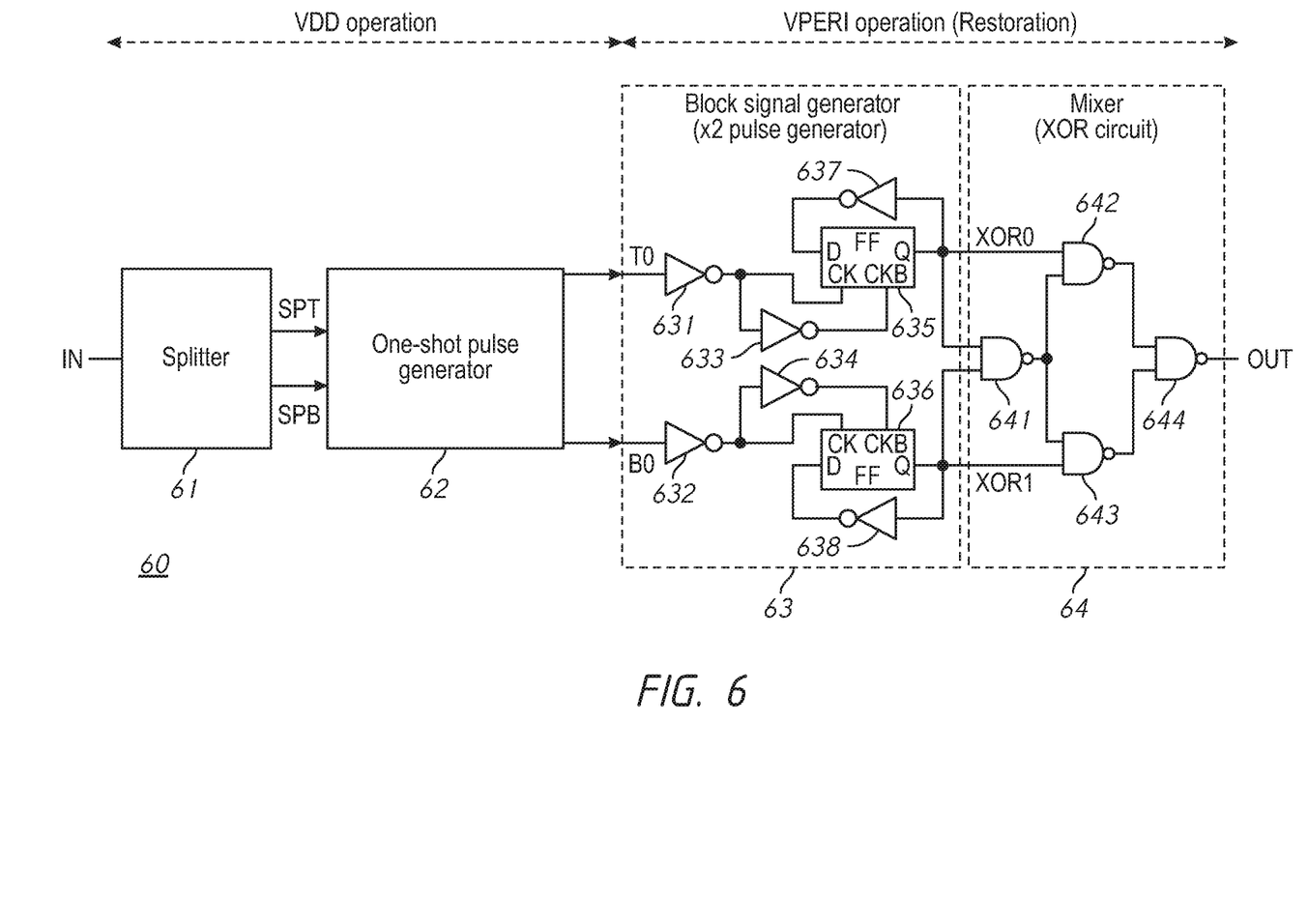
FIG. 6 is a circuit diagram of a level shifter circuit in a semiconductor device, in accordance with an embodiment of the present disclosure.

Some embodiments of a level shifter circuit include a block signal generator circuit or a mixer circuit that is different than those previously discussed with reference to FIG. 3. FIG. 6 is a circuit diagram of a level shifter circuit, in accordance with an embodiment of the present disclosure. The level shifter circuit 60 includes an ×2 pulse generator circuit 63 as the block signal generator circuit 33 of FIG. 3, and an exclusive-OR (XOR) circuit 64 as the mixer circuit 34 of FIG. 3. The splitter circuit 61 may be the same circuit as the splitter circuit 41 of FIG. 3 and the one-shot pulse generator circuit 62 may be the same circuit as the one-shot pulse generator circuit 42 of FIG. 3, consequently, description for the splitter circuit and one-shot pulse generator circuit will not be repeated.

The ×2 pulse generator circuit 63 receives the one-shot pulse signals T0 and B0 from the one-shot pulse generator circuit 62. The ×2 pulse generator circuit 63 includes two flip flop circuits 635 and 636 which function as ripple counters. An inverter 631 receives the one-shot pulse signal T0 and provides a signal to a clock node and a complementary clock node of the flip flop circuit 635 directly and via an inverter 633, respectively. The flip flop circuit 635 also receives a signal from an inverter 637 responsive to a signal XOR0 of the flip flop circuit 635. Similarly, an inverter 632 receives the one-shot pulse signal B0 and provides a signal to a clock node and a complementary clock node of the flip flop circuit 636 directly and via an inverter 634, respectively. The flip flop circuit 636 also receives a signal from an inverter 638 that receives a signal XOR1 of the flip flop circuit 636.

Figure 7:
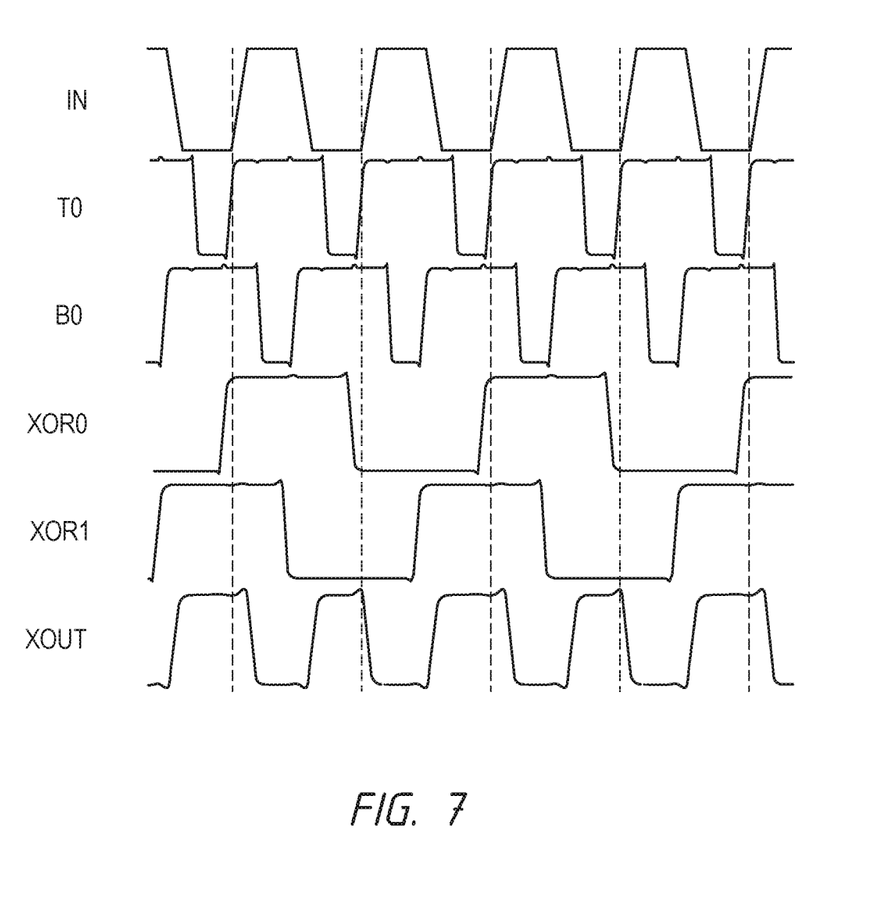
FIG. 7 is a timing diagram of signals in the level shifter circuit of FIG. 6, in accordance with an embodiment of the present disclosure.

FIG. 7 is a timing diagram of signals in the level shifter circuit of FIG. 6, in accordance with an embodiment of the present disclosure. The ×2 pulse generator circuit 63 provides the signals XOR0 and XOR1 that have a cycle period equivalent to two cycle periods of the one-shot pulse signals T0 and B0, which is also two cycle periods of the input signal IN to the level shifter circuit 60. The signal XOR0 has rising edges and falling edges corresponding to rising edges of the one-shot pulse signal T0. The signal XOR1 has rising edges and falling edges corresponding to rising edges of the one-shot pulse signal B0. That is, the ×2 pulse generator circuit 63 provides rising edges and falling edges on the signals XOR0 and XOR1 responsive to rising edges of the one-shot pulse signals T0 and B0. Thus, falling edges of the one-shot pulse signals T0 and B0 are not used for providing the signals XOR0 and XOR1. By providing the signals XOR0 and XOR1, it is possible to improve a duty cycle of a signal having duty cycle distortion caused by different phases of a rising edge and a falling edge in a cycle period.

The XOR circuit 64 receives the signals XOR and XOR1 from the ×2 pulse generator circuit 63. In one embodiment, the XOR circuit 64 may include four NAND gates 641, 642, 643 and 644 and provides a signal XOUT in FIG. 7 as an output signal OUT. A number of stages in a signal propagation path of each transition edge (e.g., rising edge, falling edge) may differ from edge to edge. In particular, an edge using the signals XOR0 and XOR1 directly provided to the NAND gates 642 and 643 may have fewer stages than an edge including a stage of the NAND gate 641 in its propagation path. Thus, a remedy circuit for duty cycle correction may be used with the XOR circuit 64.

Figure 8A:
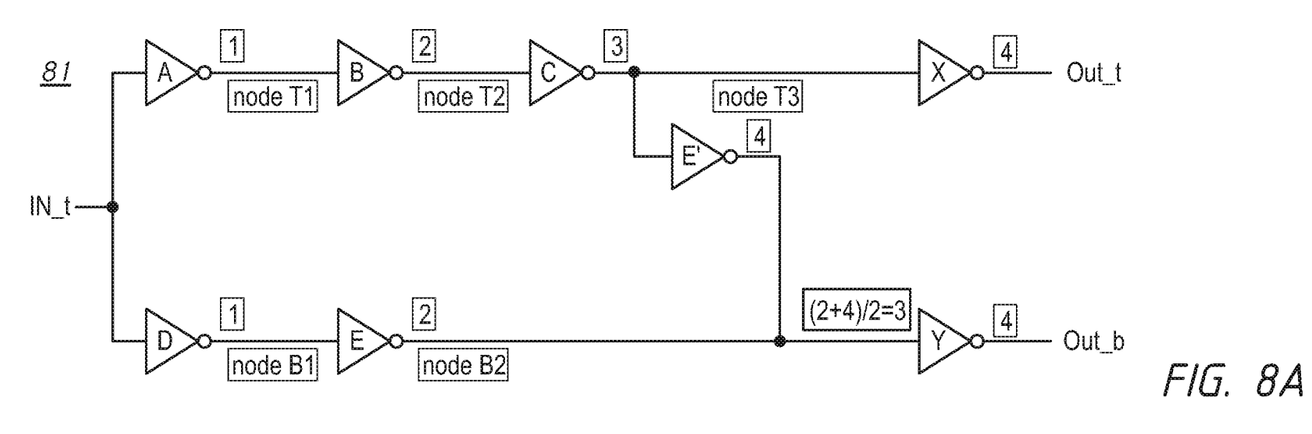
FIG. 8A is a circuit diagram of a signal splitter circuit in the level shifter circuit of FIG. 3, in accordance with embodiments of the present disclosure.

FIG. 8A is a circuit diagram of a signal splitter circuit in the level shifter circuit of FIG. 3, in accordance with embodiments of the present disclosure. In one embodiment, a splitter circuit 81 receives an input signal IN_t and provides complementary signals Out_t and Out_b having an identical phase responsive to the input signal IN_t of the splitter circuit 81, as shown in FIG. 8A. The splitter circuit 81 provides the signal Out_t a four-stage delay through a path including inverters A, B, C, X through nodes T1, T2 and T3. The splitter circuit 81 provides the complementary signal Out_b with a four-stage delay through a path including the inverters A, B, C, E', and Y through nodes T1, T2, T3 and B2, and a path including the inverters D, E, and T through nodes B1 and B2. Due to phase interpolation, a number of stages at the node B2 is three that is an average of two and four. Thus, the number of stages for the complementary signals Out_t and Out_b becomes four, the same number.

Figure 8B:
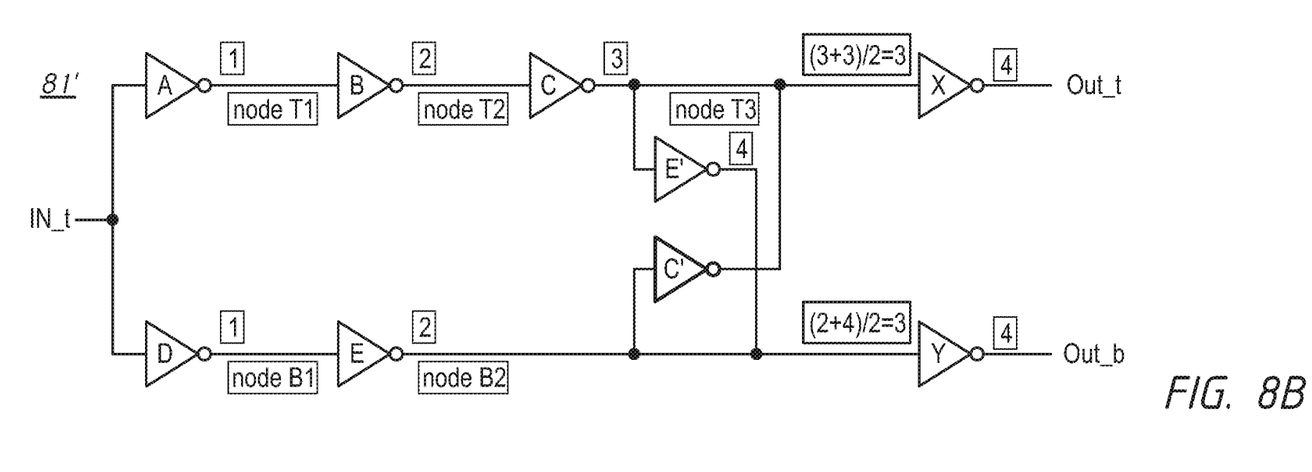
FIG. 8B is a circuit diagram of a signal splitter circuit in the level shifter circuit of FIG. 3, in accordance with embodiments of the present disclosure.

FIG. 8B is a circuit diagram of a signal splitter circuit in the level shifter circuit of FIG. 3, in accordance with embodiments of the present disclosure. Similarly, in one embodiment, the splitter circuit 81' receives an input signal IN_t and provides complementary signals Out_t and Out_b having an identical phase responsive to the input signal IN_t of the splitter circuit 81', as shown in FIG. 8B. The splitter circuit 81' provides the signal Out_t with a four-stage delay through a path including inverters A, B, C and X through nodes T1, T2 and T3 and a path including inverters D, E, C' and X through nodes B1, B2 and T3. The splitter circuit 81' provides the complementary signal Out_b with a four-stage delay through a path including inverters A, B, C, E' and Y through nodes T1, T2, T3 and B2, and a path including inverters D, E, and Y through nodes B1 and B2. Due to phase interpolation, a number of stages at the node B2 is three that is an average of two and four. Thus, the number of stages for the complementary signals Out_t and Out_b becomes four, the same number.

Splitter circuits, a one-shot pulse generator circuit, block signal generator circuits, and mixer circuits shown in FIGS. 3, 4, 5, 8A and 8B and described above are merely examples of circuits that may be used. In fact, other types of the circuits may be used to provide similar functionalities described above. For example, an XOR circuit, which may be used as a mixer circuit, may include any logic gates and components in the XOR circuit are not limited to a combination of NAND gates.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. A level shifter circuit comprising:
   a splitter circuit configured to receive an input signal, and further configured to operate on a first voltage potential of the input signal to provide a first signal and a second signal responsive to the input signal, wherein the first and second signals have opposite polarities to each other;
   a one-shot pulse generator circuit configured to operate on the first voltage potential to provide a first one-shot pulse signal responsive to the first signal and a second one-shot pulse signal responsive to the second signal, wherein each of the first and second one-shot pulse signals includes first transition edges and second transition edges opposite in direction from the first transition edges; and
   a logic circuit configured to operate on a second voltage potential to provide a third signal responsive to the first and second one-shot pulse signals, the second voltage potential being different from the first voltage potential, wherein the logic circuit comprises:
      a first pulse generator configured to:
         receive the first one-shot pulse signal to provide a fourth signal, wherein each of transition edges of the fourth signal corresponds to a respective first edge of the first one-shot pulse signal, and
      a second pulse generator configured to:
         receive the second one-shot pulse signal to provide a fifth signal,
         wherein each of transition edges of the fifth signal corresponds to a respective first edge of the second one-shot pulse signal; and
      a mixer configured to receive the fourth and fifth signals and further configured to provide the third signal responsive to the fourth and fifth signals.

2. The level shifter circuit of claim 1, wherein the mixer is an XOR gate configured to provide the third signal by executing a logic XOR operation of the fourth and fifth signals.

3. The level shifter circuit of claim 1, wherein a cycle period of the fourth signal is twice a cycle period of the first signal, and
   wherein a cycle period of the fifth signal is twice a cycle period of the second signal.

4. The level shifter circuit of claim 1, wherein cycle period of the fourth signal is twice a cycle period of the first one-shot pulse signal, and
   wherein a cycle period of the fifth signal is twice a cycle period of the second one-shot pulse signal.

5. The level shifter circuit of claim 4, wherein a cycle period of the third signal is same as a cycle period of the first one-shot pulse signal and the second one-shot pulse signal.

6. The level shifter circuit of claim 1, wherein the logic circuit is further configured to provide the fourth signal responsive to the first one-shot pulse signal, and to provide the fifth signal responsive to the second one-shot pulse signal.

7. The level shifter circuit of claim 1, wherein the one-shot pulse generator circuit comprises:
   a first delay circuit configured to provide a first delay to an inverted signal of the first signal; and
   a second delay circuit configured to provide a second delay to an inverted signal of the first signal.

8. The level shifter circuit of claim 7, wherein the one-shot pulse generator circuit further comprises:
   a first logic gate configured to provide the first one-shot pulse signal having a one-shot pulse width corresponding to the first delay; and
   a second logic gate configured to provide the second one-shot pulse signal having a one-shot pulse width corresponding to the second delay.

9. The level shifter circuit of claim 1,
   wherein each of the transition edges of the fourth signal is responsive to a rising transition edge of the first one-shot pulse signal; and
   wherein each of the transition edges of the fifth signal is responsive to a rising transition edge of the second one-shot pulse signal.

10. An apparatus comprising:
a splitter circuit configured to receive an input signal having an amplitude of a first voltage and further configured to provide a first signal and a second signal that is a complementary signal of the first signal responsive to the input signal;
a one-shot pulse generator circuit configured to receive the first signal and the second signal, and further configured to provide a first one-shot pulse signal and a second one-shot pulse signal, wherein each of the first and second one-shot pulse signals includes rising edges and falling edges;
a block signal generator circuit comprising:
    a first pulse generator configured to receive the first one-shot pulse signal to provide a third signal corresponding to the rising edges of the first one-shot pulse signal, the third signal including block pulses having an amplitude of a second voltage different than the first voltage, and
    a second pulse generator configured to receive the second one-shot pulse signal to provide a fourth signal corresponding to the rising edges of the second one-shot pulse signal, the fourth signal including block pulses having an amplitude of the second voltage; and
a mixer circuit configured to receive the third signal and the fourth signal, and further configured to provide an output signal having an amplitude of the second voltage and a duty cycle of the input signal, responsive to the third signal and the fourth signal.

11. The apparatus of claim 10, wherein the one-shot pulse generator circuit comprises:
a first delay circuit configured to provide a first delay on an inverted signal of the first signal;
a first logic gate configured to provide the first one-shot pulse signal having a one-shot pulse width corresponding to the first delay responsive to the first signal and an output signal of the first delay circuit;
a second delay circuit configured to provide a second delay on an inverted signal of the first signal; and
a second logic gate configured to provide the second one-shot pulse signal having a one-shot pulse width corresponding to the second delay responsive to the second signal and an output signal of the second delay circuit.

12. The apparatus of claim 11, wherein the block signal generator circuit is configured to provide the third signal and the fourth signal having a cycle period twice a cycle period of the input signal.

13. The method of claim 10, wherein providing the output signal comprises mixing the third signal and fourth signal, and correcting phase differences between the third signal and the fourth signal.

14. A method, comprising:
receiving an input signal;
providing a first signal having an amplitude between a first voltage and a reference voltage;
providing a second signal that is a complementary signal of the first signal;
providing a first one-shot pulse signal responsive to the first signal, the first one-shot pulse signal including first transition edges and second transition edges opposite in direction from the first transition edges;
providing a second one-shot pulse signal responsive to the second signal, the second one-shot pulse signal including first transition edges and second transition edges opposite in direction to the first transition edges;
providing a third signal having an amplitude between a second voltage, which is different from the first voltage, and the reference voltage, and further having transition edges corresponding to respective first transition edges of the first one-shot pulse signal;
providing a fourth signal having an amplitude between the second voltage and the reference voltage, and further having transition edges corresponding to respective first transition edges of the second one-shot pulse signal; and
providing an output signal having an amplitude between the second voltage and the reference voltage responsive to the third signal and the fourth signal.

15. The method of claim 14, wherein providing the first one-shot pulse signal responsive to the first signal comprises:
providing a first delay signal by causing a first delay on an inverted signal of the first signal; and
providing the first one-shot pulse signal having a one-shot pulse width corresponding to the first delay responsive to the first signal and the first delay signal, and
wherein providing the second one-shot pulse signal responsive to the second signal comprises:
    providing a second delay signal by causing a second delay on an inverted signal of the second signal; and
    providing the second one-shot pulse signal having a one-shot pulse width corresponding to the second delay responsive to the second signal and the second delay signal.

16. The method of claim 14, wherein the output signal includes transition edges responsive to the first and second one-shot pulse signals.

17. A level shifter circuit comprising:
a splitter circuit configured to receive an input signal, and further configured to operate on a first voltage potential of the input signal to provide a first signal and a second signal responsive to the input signal, wherein the first and second signals have opposite polarities to each other;
a one-shot pulse generator circuit configured to operate on the first voltage potential to provide a first one-shot pulse signal responsive to the first signal and a second one-shot pulse signal responsive to the second signal; and
a logic circuit configured to operate on a second voltage potential to provide a third signal responsive to the first and second one-shot pulse signals, the second voltage potential being different from the first voltage potential,
wherein the logic circuit comprises:
    a pulse generator configured to provide a fourth signal and a fifth signal responsive to the first one-shot pulse signal and the second one-shot pulse signal, respectively; and
    a mixer configured to receive the fourth and fifth signals and further configured to provide the third signal responsive to the fourth and fifth signals,
wherein the pulse generator comprises:
    a first flip flop circuit configured to receive the first one-shot pulse signal, an inverted signal of the first one-shot pulse signal, and an inverted signal of the fourth signal and further configured to provide the fourth signal; and
    a second flip flop circuit configured to receive the second one-shot pulse signal, an inverted signal of the second one-shot pulse signal, and an inverted signal of the fifth signal and further configured to provide the fifth signal.

18. An apparatus comprising:
a splitter circuit configured to receive an input signal having an amplitude of a first voltage and further configured to provide a first signal and a second signal that is a complementary signal of the first signal responsive to the input signal;
a one-shot pulse generator circuit configured to receive the first signal and the second signal, and further configured to provide a first one-shot pulse signal and a second one-shot pulse signal;
a block signal generator circuit configured to provide a third signal and a fourth signal including block pulses having an amplitude of a second voltage, responsive to the first one-shot pulse signal and the second one-shot pulse signal, the second voltage different than the first voltage; and
a mixer circuit configured to receive the third signal and the fourth signal, and further configured to provide an output signal having an amplitude of the second voltage and a duty cycle of the input signal, responsive to the third signal and the fourth signal, wherein the pulse generator comprises:
　a first flip flop circuit configured to receive the first one-shot pulse signal, an inverted signal of the first one-shot pulse signal, and an inverted signal of the third signal and further configured to provide the third signal; and
　a second flip flop circuit configured to receive the second one-shot pulse signal, an inverted signal of the second one-shot pulse signal, and an inverted signal of the fourth signal and further configured to provide the fourth signal.

19. A method comprising:
receiving an input signal;
providing a first signal having an amplitude between a first voltage and a reference voltage;
providing a second signal that is a complementary signal of the first signal;
providing a first one-shot pulse signal responsive to the first signal;
providing a second one-shot pulse signal responsive to the second signal;
providing a third signal having an amplitude between a second voltage, which is different from the first voltage, and the reference voltage, and further having a first transition edge responsive to the first one-shot pulse signal;
providing a fourth signal having an amplitude between the second voltage and the reference voltage, and further having a first transition edge responsive to the second one-shot pulse signal;
providing an output signal having an amplitude between the second voltage and the reference voltage responsive to the third signal and the fourth signal, wherein the output signal includes transition edges responsive to the first and second one-shot pulse signals;
receiving the first one-shot pulse signal, an inverted signal of the first one-shot pulse signal, and an inverted signal of the third signal by a first flip flop circuit;
providing the third signal by the first flip flop circuit;
receiving the second one-shot pulse signal, an inverted signal of the second one-shot pulse signal, and an inverted signal of the fourth signal by a second flip flop circuit; and
providing the fourth signal by the second flip flop circuit.

* * * * *